(12) United States Patent
Uchikawa

(10) Patent No.: US 6,485,870 B1
(45) Date of Patent: Nov. 26, 2002

(54) CHARGED-PARTICLE-BEAM MICROLITHOGRAPHY MASKS AND METHODS FOR MANUFACTURING SAME

(75) Inventor: Kiyoshi Uchikawa, Tsukuba (JP)

(73) Assignee: Nikon Corporation, Tokyo (JP)

(*) Notice: Subject to any disclaimer, the term of this patent is extended or adjusted under 35 U.S.C. 154(b) by 15 days.

(21) Appl. No.: 09/666,730

(22) Filed: Sep. 20, 2000

(30) Foreign Application Priority Data

Sep. 21, 1999 (JP) .......................................... 11-267311

(51) Int. Cl.$^7$ .............................. G03F 9/00; G03C 5/00
(52) U.S. Cl. .......................................... 430/5; 430/296
(58) Field of Search ............................ 430/5, 322, 296; 250/492.3

(56) References Cited

U.S. PATENT DOCUMENTS 5,756,234 A * 5/1998 Groves et al. ................. 430/5
5,795,688 A * 8/1998 Burdorf et al. ................ 430/5

\* cited by examiner

Primary Examiner—S. Rosasco
(74) Attorney, Agent, or Firm—Klarquist Sparkman LLP

(57) ABSTRACT

Methods are disclosed for manufacturing masks (reticles) as used in charged-particle-beam (CPB) microlithography. The methods can include inspecting the masks for defects, and repairing the defects. First, a "parent" mask is prepared from circuit-design data. The resulting pattern elements on the parent mask are inspected and compared with the circuit-design data to determine whether the data have been converted accurately into corresponding pattern elements on the parent mask. This inspection can be performed using an optical microscope. Detected mismatches and defects are corrected as required. The parent mask is used as a microlithography mask in the preparation, by "reduction" optical microlithography, a "progeny" mask. The pattern defined by the progeny mask is imaged and the image is digitized for comparison with a digitized image of the parent mask. The digitized images are compared using a computer. Any detected repairable defects are repaired, thereby completing fabrication of the CPB microlithography mask.

18 Claims, 3 Drawing Sheets

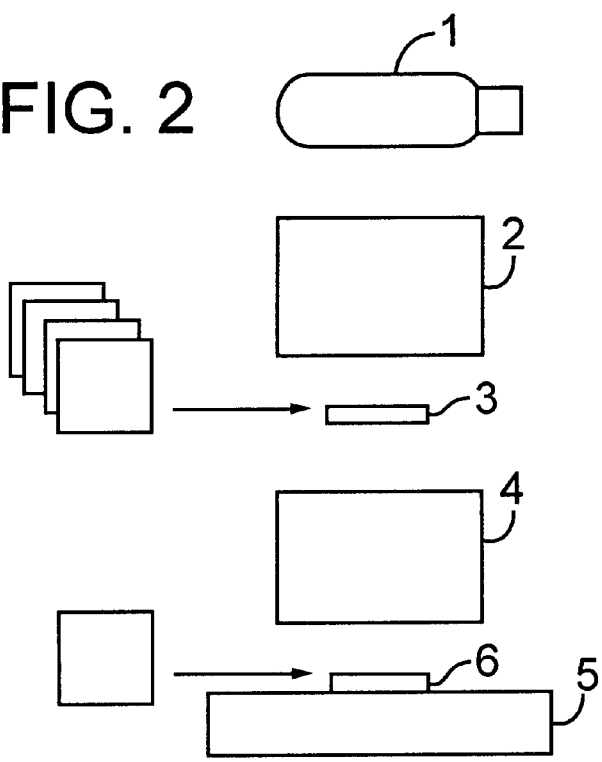
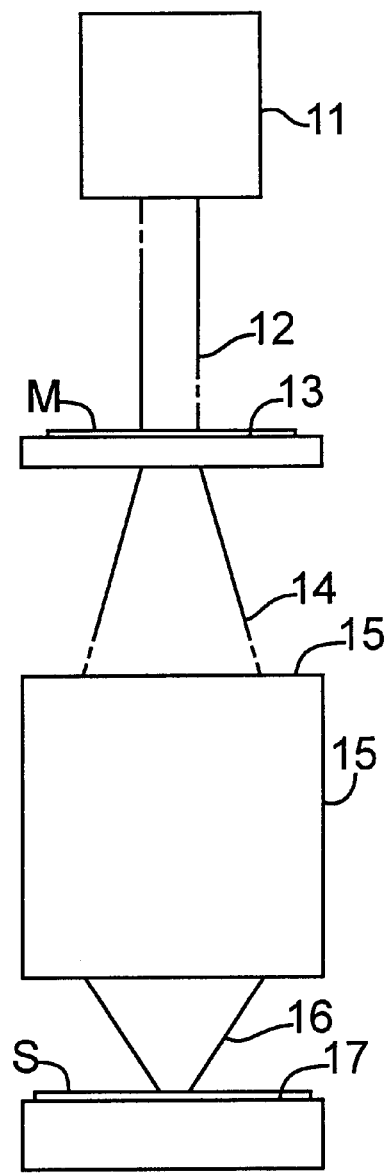

CHARGED-PARTICLE-BEAM MICROLITHOGRAPHY MASKS AND METHODS FOR MANUFACTURING SAME

FIELD OF THE INVENTION

This invention pertains to microlithography (transfer of a pattern, defined by a reticle or mask, to a suitable substrate). Microlithography is a key technology used in the manufacture of microelectronic devices such as integrated circuits, displays, and the like. More specifically, the invention pertains to microlithography performed using a charged particle beam as an energy beam. Yet more specifically, the invention pertains to reticles and masks as used in charged-particle-beam microlithography and to methods for inspecting such reticles and masks to ascertain whether they have been formed properly.

BACKGROUND OF THE INVENTION

Conventionally, microelectronic devices (e.g., semiconductor integrated circuits, displays, and the like) are manufactured by a complex series of steps. Many of the steps involve microlithography, by which a pattern, defined by a reticle or mask (collectively termed a "mask" herein) is transferred via an energy beam to a suitable substrate such as a semiconductor wafer. In microlithography apparatus as currently available and in use, the energy beam is a light beam (usually ultraviolet light); an image of the mask pattern is transferred by projection, in which the light beam passes from the mask through a projection-optical system to the substrate.

Despite the ability of current technology to achieve microlithographic resolution of about 0.25 $\mu$m, much conventional "optical" microlithography (in which a light beam is used) still is performed at a resolution (minimum pattern-element width, or "critical dimension") of about 1 $\mu$m. Microlithography in which the critical dimension is about 1 $\mu$m or higher typically is performed at 1:1 ("full size"), by which is meant that the image as formed on the substrate is the same size as the image defined on the mask. However, as the required (and achievable) critical dimension has been reduced to below 1 $\mu$m, the benefits of "demagnifying" the image as formed on the substrate have increased. For example, some current microlithography is performed at a "demagnification ratio" of ¼, by which is meant that the image as formed on the substrate is ¼ the size of the pattern as defined on the mask. Microlithography performed at a demagnification ratio of less than unity is termed "reduction" microlithography. In reduction microlithography, the fact that all the pattern elements defined on the mask are bigger (by the reciprocal of the demagnification ratio) than the corresponding pattern elements as transferred to the substrate, the necessary accuracy with which the pattern elements are defined on the mask is eased correspondingly.

Many conventional masks are produced using electron-beam or laser-beam patterning, in which the pattern on the mask is "drawn" line-by-line and element-by-element. Unfortunately, these "direct-writing" mask-making techniques consume large amounts of time. Other mask-making techniques have been developed in which the masks themselves are produced using a microlithography technique, wherein the mask used to produce the mask used in microlithography of a substrate is termed the "parent" mask and the mask produced using the parent mask (and used in microlithography of a substrate) is termed the "progeny" mask. Reduction microlithography allows parent and progeny masks to be made with high accuracy. For example, the critical dimension in a progeny mask often can be reduced according to the demagnification ratio, relative to the critical dimension in the parent mask.

In producing a progeny mask from a parent mask, it is necessary to ascertain whether the pattern (as defined on the parent mask) has been transferred to the progeny mask properly and accurately. Conventionally, inspections are performed using an optical microscope, with which an enlarged image of the pattern on the parent mask is inspected and compared with a reference pattern. To achieve satisfactory inspection, the imaging resolution of the optical microscope should be approximately ten times finer than the minimum element size of the pattern being inspected. Because the imaging resolution of a current mask-inspection device employing an optical microscope is on the order of 0.1 $\mu$m, the minimum pattern-element size on a mask that can be inspected in this manner is approximately 1 $\mu$m.

The time required to perform a mask inspection depends upon the minimum pattern-element width of the pattern defined by the mask and on the target measurement accuracy. For example, a 5-inch mask can be inspected in approximately two hours.

With the increased integration of circuit elements in semiconductor integrated circuits ("chips"), the critical dimension of circuit elements in such circuits rapidly is approaching 100 nm, which is the expected critical dimension in the next generation of integrated circuits. It currently is impossible to transfer patterns having such small circuit elements onto a wafer using conventional optical microlithography equipment. As a result, so-called "divided-reticle" microlithography methods and apparatus utilizing a charged particle beam (e.g., electron beam) have been the subjects of intensive development effort. By "divided-reticle" is meant that the pattern as defined on the reticle is divided into multiple pattern portions that are exposed individually, rather than having the entire reticle pattern for a chip transferred in a single exposure "shot."

Divided microlithography typically is performed in a "reduced" manner, with a demagnification ratio of, for example, ¼ or ⅕. At a demagnification ratio of ¼, attainment of a resolution of 100 nm on the wafer requires that the minimum dimension of the circuit pattern formed on the mask be approximately 400 nm. To adequately inspect such a mask, the inspection device must have a resolution of 40 nm. Consequently, an optical microscope cannot be used. The use of an SEM (scanning electron microscope) instead of an optical microscope has been considered, but an SEM is impractical because of the massive amount of time required to analyze and compare the pattern as formed on the mask with the circuit-design data used to create the pattern on the mask.

Hence, with respect to masks as used in charged-particle-beam microlithography of a pattern at a resolution of about 100 nm, there is a need for an effective and practical method for inspecting the circuit pattern formed in the mask.

SUMMARY OF THE INVENTION

In view of the shortcomings of the prior art as summarized above, an object of the invention is to provide practical methods for inspecting charged-particle-beam (CPB) microlithography masks, especially for such methods that can be used in conjunction with methods for fabricating such masks.

According to a first aspect of the invention, methods are provided for fabricating a charged-particle-beam (CPB)

mask. In a representative embodiment of such a method, a parent mask is provided that defines elements of a desired circuit pattern. Using the parent mask as a lithography mask, the pattern defined on the parent mask is transferred (desirably by optical lithography) to a progeny mask by reduction lithography. The progeny mask (destined to become the CPB mask) defines elements of the desired circuit pattern that correspond to but are smaller than corresponding elements on the progeny mask. The pattern as formed on the progeny mask is compared with the pattern formed in the parent mask to determine the accuracy with which the progeny mask defines the circuit pattern.

In the foregoing method, the step of providing the parent mask desirably includes the steps of preparing circuit-design data for the desired circuit pattern, converting the data into circuit-pattern elements to be defined by the parent mask, and preparing the parent mask from the converted data.

After providing the parent mask, the foregoing method desirably can include the step of comparing and contrasting the parent mask with data concerning the desired circuit pattern. If the parent mask corresponds with the data concerning the desired circuit pattern, then the method further can include determining whether the parent mask has any defects. If the parent mask has defects that are repairable, then the defects are repaired. If the parent mask has defects that are not repairable, then the parent mask is discarded.

The foregoing method filter can include determining whether the progeny mask has any defects. If the progeny mask has defects that are repairable, then the defects are repaired. If the progeny mask has defects that are not repairable, then the progeny mask is discarded.

According to another aspect of the invention, CPB masks are provided that are made by a method as summarized above.

According to another aspect of the invention, methods are provided for performing CPB microlithography. In a representative embodiment, a CPB mask is provided as summarized above. A CPB illumination beam is directed to a region on the CPB mask, and a CPB patterned beam, formed by passage of charged particles of the illumination beam passing through the illuminated region on the CPB mask, is directed to a sensitive substrate.

According to another aspect of the invention, methods are provided for manufacturing a microelectronic device. Representative embodiments of such methods include the steps of providing a sensitive substrate; and performing CPB microlithography of the sensitive substrate, according to the method summarized above.

The foregoing and additional features and advantages of the invention will be more readily apparent from the following detailed description, which proceeds with reference to the accompanying drawings.

BRIEF DESCRIPTION OF THE DRAWINGS

FIG. 2 is a schematic elevational depiction of an optical microlithography apparatus that can be used to fabricate a "progeny mask" as used for performing CPB microlithography.

FIG. 3 is a schematic elevational depiction of a divided-reticle CPB microlithography apparatus with which a CPB microlithography mask according to the invention can be used.

DETAILED DESCRIPTION

Figure 1:
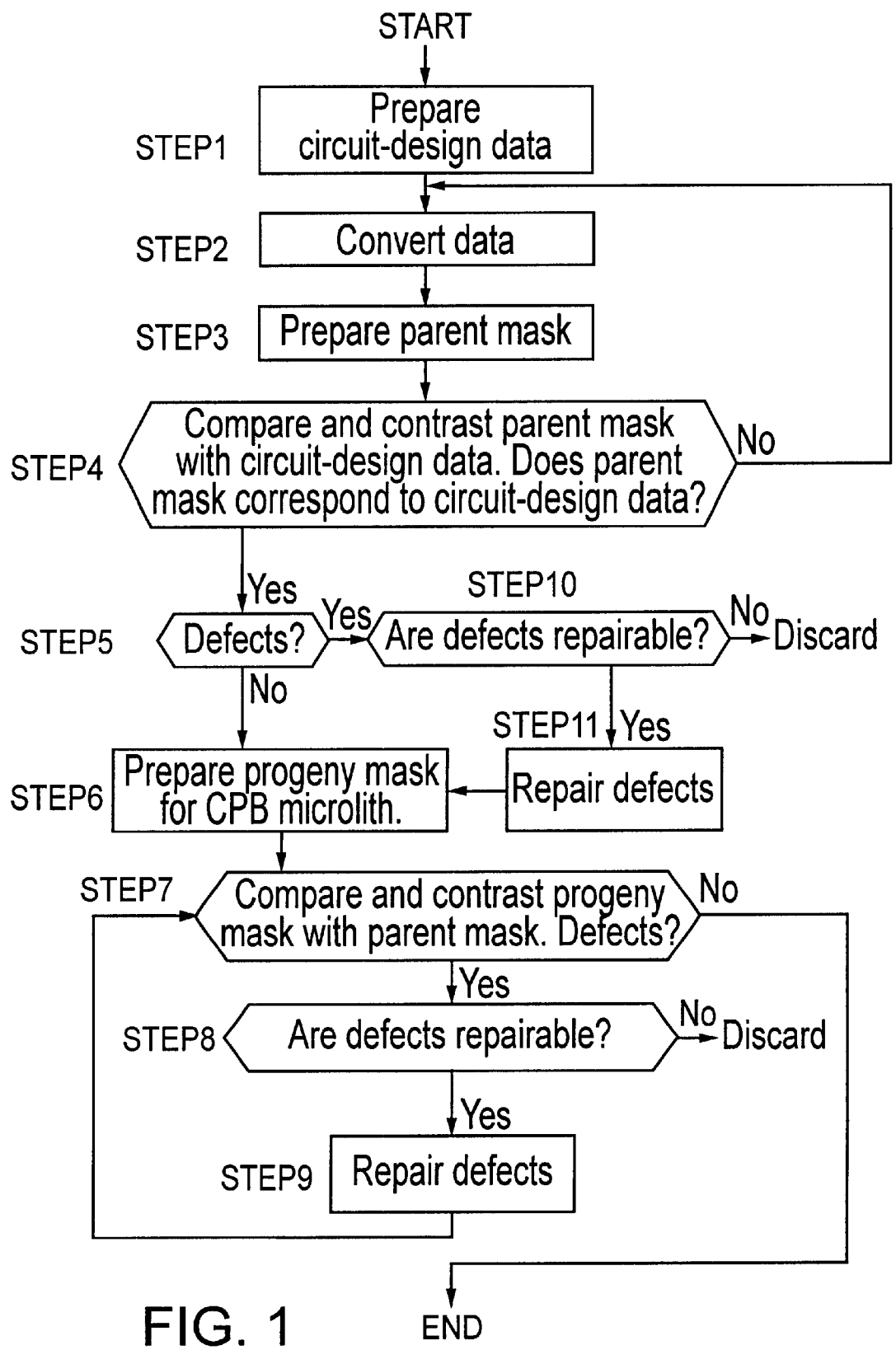
FIG. 1 is a flowchart of a representative embodiment of a method, according to the invention, for fabricating and inspecting a charged-particle-beam (CPB) microlithography mask (reticle).

FIG. 1 is a flowchart of a representative embodiment of a method, according to the invention, for fabricating and inspecting a pattern defined by a mask to be used for charged-particle-beam (CPB) microlithography.

In STEP 1, circuit-design data are prepared. Circuit-design data pertain to the actual types, relative positions, and interconnections of circuit elements to be included in the subject microelectronic device, especially as defined in the particular layer to be defined by the mask.

In STEP 2, a data conversion is performed in which the circuit-design data for the particular layer is converted into corresponding mask-pattern data. This step normally is performed using a powerful computer having a large memory to store the circuit-design data. Basically, this step involves the translation of the data regarding the portion of the actual electronic circuit to be formed in the subject layer into data regarding the placement and shapes of, e.g., transistor gates, conductors, and other circuit elements to be defined in the subject layer by the corresponding mask.

In STEP 3, a parent mask (also termed a "photomask" herein) is prepared, according to the mask-pattern data, by a mask-patterning apparatus (such as an apparatus using an electron beam to "draw" the pattern on a film of resist on a suitable mask blank). The film of resist, after exposure and development, serves as an "etching mask" used during an etching step to define the pattern elements of the parent mask on the mask blank.

In STEP 4, the pattern elements on the parent mask are inspected and compared with the circuit-design data to determine whether the circuit-design data have been converted accurately and correctly into corresponding respective pattern elements on the parent mask. All detected instances in which such conversion has been performed incorrectly or inaccurately are noted as respective "defects."

The inspection in STEP 4 is performed as follows. The parent mask is mounted to a stage. An enlarged image of a selected region of the circuit pattern as formed on the parent mask is formed using an optical microscope. The image is routed to a data processor, which performs comparative pattern-element matching to evaluate whether the circuit elements as defined on the parent mask are acceptable. The stage is moved and the imaging operation is repeated as required to inspect the circuit elements on the entire surface of the parent mask.

As noted above, the parent mask will be used to fabricate a progeny mask (the actual mask as used for CPB microlithography) using reduction microlithography (demagnification ratio of, e.g., ¼). By way of example, if the minimum circuit-element width on a progeny mask made from the parent mask is 320 nm, then the minimum circuit-element width on the parent mask (at ¼ demagnification) is 1.28 $\mu$m. In this inspection step (STEP 4), an inspection resolution of 0.2 $\mu$m or finer is required to inspect edges of pattern elements on the parent mask. Since the imaging resolution obtainable using an optical microscope currently is approximately 0.1 $\mu$m, inspection can be performed readily using an optical microscope.

If the inspection in STEP 4 reveals a mismatch between the pattern in the parent mask and the circuit-design data, then data conversion (STEP 2) and preparation of the parent mask (STEP 3) are repeated as required to correct the mismatch. A mismatch is not a defect. Rather, a mismatch is simply an inaccurate or improper translation of circuit-design data into a corresponding pattern element on the parent mask.

If the parent mask contains no mismatches relative to the circuit-design data, then any defects in the parent mask are identified (STEP 5). Defects include "clear defects" and "opaque defects." A clear defect is a locus at which an otherwise properly opaque region of the pattern is missing, and an opaque defect is a locus at which an otherwise properly clear region of the pattern is opaque. A clear defect typically arises when a corresponding bit of the resist (used in the preparation of the parent mask from the mask blank) is missing, and an opaque defect typically arises from the presence of a particle of beam-occluding debris on the etching mask. Both types of defects can result in significant defects in the pattern as transferred later during microlithography of the pattern from the progeny mask to a substrate.

If defects are evident in the parent mask, a determination is made as to whether the defects are repairable (STEP 10). If the defects are not repairable, then the parent mask is discarded. If the defects are repairable, then the parent mask is processed so as to repair the defects (STEP 11). For example, certain of these defects can be repaired using a focused ion beam.

Next, if the parent mask has been adjudged by inspection to be acceptably free of defects, then the parent mask is mounted in an optical microlithography apparatus so as to prepare a progeny mask by optical microlithography (STEP 6). The progeny mask also is termed a "CPB microlithography mask."

FIG. 2 schematically depicts an optical microlithography apparatus as used in the manufacture of the progeny mask from the parent mask. The FIG. 2 apparatus includes a light source 1 that produces a light beam. The light beam from the light source 1 passes through an illumination-optical system 2 to the parent mask (photomask) 3. Light passing through the parent mask 3 passes through a "reduction" projection-optical system 4 to a progeny-mask blank 6 mounted on a stage 5. The progeny-mask blank includes a mask membrane coated with a film of a suitable photoresist. The illumination-optical system 2 converts the light beam from the light source 1 to a uniform illumination-light flux. The illumination-light flux illuminates the parent mask 3. An image of the parent-mask pattern is demagnified (by a factor of, e.g., ¼) by the projection-optical system 4 and formed on the resist-coated surface of the progeny mask blank 6.

After exposure of the progeny-mask blank 6, the photoresist is developed, and the developed photoresist is removed to reveal the resist pattern. The membrane of the progeny-mask blank 6 is etched using the resist pattern as an etching mask. At a demagnification ratio of ¼, the resulting pattern elements formed on the membrane of the mask blank 6 are four times smaller than the corresponding pattern elements on the parent mask 3. Thus, fabrication of the progeny mask 6 is complete.

It is possible that defects in the process so far have become manifest in the resulting progeny mask. In this example, since the minimum pattern-element width on the progeny mask is 320 nm, at least some defects cannot be resolved using an optical microscope. Consequently, inspection of the progeny mask (STEP 7) is performed by the following method. The pattern defined in the progeny mask is illuminated using an electron beam (e.g., a scanning electron microscope) to produce an image of the pattern. The resulting image is digitized at a specified pixel size (e.g., a pixel size of approximately 1/10 the critical dimension). The digitized data are compared at high speed with a digitized image of the parent mask using a computer. If inspection reveals no defects, then inspection of the progeny mask is complete.

If a defect is detected (typically as a discrepancy in the pattern on the progeny mask relative to a corresponding portion of the pattern on the parent mask), a determination is made as to whether the defect can be repaired (STEP 8). During the previous data-comparison step (STEP 7), any pattern deformation in the progeny mask arising from aberrations in the optical microlithography apparatus used to prepare the progeny mask is taken into consideration in the determination of whether a defect exists. Discrepancies that otherwise would be attributable to such aberrations are corrected in advance (by execution of appropriate computer software programmed into the computer used to compare the digitized data). I.e., the computer desirably is pre-programmed to account for changes in the size and inclination of pattern features caused by aberrations, and to make appropriate corrections to the data being compared.

As noted above, a defect can be a clear defect or an opaque defect. If the defect is repairable, then the progeny mask is processed (STEP 9) to correct the defect. If it is determined that the defect cannot be corrected, then the progeny mask is discarded. Repair of an opaque defect can be accomplished by selective etching using a focused ion beam or the like. Repair of a clear defect can be performed using a selective film-formation method (e.g., FIB-CVD, EB-CVD, or selective plasma CVD) in which a focused ion beam (FIB), electron beam (EB), or ultra-fine plasma, respectively, is directed to the locus of the defect while supplying a specified reactive gas to the locus to perform chemical vapor deposition (CVD) at the locus.

Next, a representative method is described for manufacturing microelectronic devices (e.g., integrated circuits or other "chips") using a "divided-reticle" charged particle-beam (CPB) microlithography apparatus and a progeny mask produced and inspected by the method described above.

A representative divided-reticle CPB microlithography apparatus is shown in FIG. 3. By way of example, the FIG. 3 apparatus utilizes an electron beam as a representative charged particle beam. However, it will be understood that the same principles can be applied with equal facility to use of an alternative charged particle beam such as an ion beam. The FIG. 3 apparatus comprises, in order, an illumination-optical system 11, a mask stage 13, a projection-optical system 15, and a substrate stage 17. The progeny mask M is mounted on the mask stage 13, and a suitable sensitive substrate S (e.g., semiconductor wafer coated with a suitable resist) is mounted to the substrate stage 17. The illumination-optical system 11 produces a collimated "illumination beam" 12 of electrons for illuminating a selected region of the mask M. Electrons of the illumination beam 12 passing through the illuminated region of the mask M propagate as a "patterned beam" 14 to the projection-optical system 15. The projection-optical system 15 forms a demagnified image of the illuminated region of the mask M on a corresponding region of the surface of the substrate S. The image as formed on the substrate S has a size that nominally is equal to the size of the corresponding illuminated region on the mask M multiplied by the demagnification ratio of the projection-optical system 15.

The substrate S can be exposed in a "step-and-repeat" or a "scanning" manner. In "step-and-repeat" exposure, the mask M and substrate S are moved (by the respective stages 13, 17) in a discontinuous manner from one exposure to the next. In "scanning" exposure, the mask M and substrate S are moved (by the respective stages 13, 17) in a continuous scanning manner from one exposure to the next. The scanning motions of the mask M and substrate S are synchronous.

Figure 4:
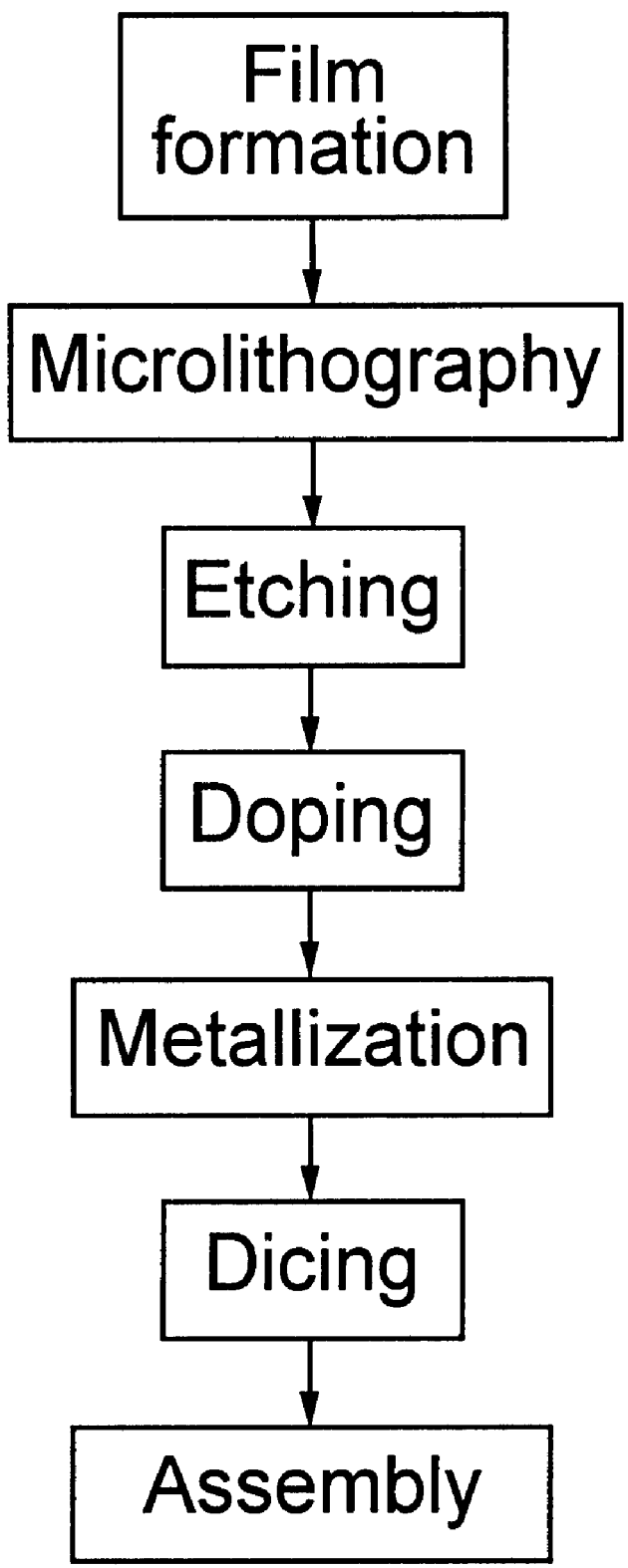
FIG. 4 is a block diagram of a process for manufacturing microelectronic devices.

An overview of a microelectronic-device fabrication process is shown in FIG. 4. The FIG. 4 process is directed specifically to fabrication of silicon integrated circuit "chips." However, it will be understood that an analogous process can be applied to the fabrication of any of various other microelectronic devices.

In the first step of FIG. 4 ("Film formation"), a silicon wafer is prepared and one or more layers of specific materials are formed on a surface of the silicon wafer. Typically, a first insulating layer (usually silicon oxide) is formed first on the surface of the silicon wafer. A second layer can be formed on the first insulating layer. A first insulating layer of silicon oxide can be formed by any of various known techniques, such as thermal oxidation, in which the surface of the silicon wafer is oxidized directly. Alternatively, the silicon oxide layer can be formed by CVD or sputtering. The technique used to form the second layer (if applied) differs depending upon the composition and intended function of the second layer. For example, the second film can be a conductive film or another insulating film. A representative conductive film is a film of aluminum or tungsten, and a representative insulating film is silicon oxide. Any of various respective known techniques can be selected to form the second layer.

In the next step ("Microlithography"), a layer of resist is applied to the substrate so as to "sensitize" the substrate (i.e., render the surface of the substrate capable of being imprinted with a latent image projected from the mask). For example, the resist layer can be applied to the first insulating layer of the substrate. The resulting sensitized substrate is mounted to the substrate stage 17 of an apparatus such as that shown in FIG. 3. Meanwhile, the mask (progeny mask manufactured as described above) is mounted in the mask stage 13. In the apparatus of FIG. 3, the illumination beam 12 from the illumination-optical system 11 is directed to a specified location on the mask M. The resulting patterned beam 14 is directed, by means of the projection-optical system 15, to the sensitized surface of the substrate S so as to imprint the substrate with an image of the illuminated portion of the mask pattern.

In the subsequent "Etching" step, the exposed resist (now imprinted with the mask pattern) is developed, and the developed resist is removed to form an etching mask. Etching is conducted to etch the underlying layer(s) according to the openings in the etching mask. After etching, the etching mask is removed.

The "Doping" step typically follows the Etching step. Doping results in the controlled introduction of a desired type and amount of "dopant" or impurity into the layer(s) exposed during the Etching step. Usually, to perform doping, a resist pattern is applied microlithographically to the substrate; openings in the resist pattern correspond to regions in which the dopant is to be introduced into the exposed layer(s) beneath the resist. Representative dopants include, but are not limited to, B, P, and As. The dopant can be introduced by, for example, ion bombardment, using the resist pattern as a mask.

The steps of film formation, microlithography, etching, and doping are repeated as required to form, in a sequential manner, layered patterns on the substrate. The patterns overlap to form 3-dimensional structures on the substrate corresponding to basic circuit elements such as active areas, fields, and gates of MOS transistors, as well as contact holes that form inter-layer connections.

In the "Metallization" step, the contact holes and other selected loci are interconnected electrically by "wiring" traces to form the desired microelectronic devices. The wiring traces are formed by conventional "metallization" techniques. Typically, multiple layers of wiring traces, separated from each other by intervening insulating layers and interconnected with each other by contact holes, are formed to complete the required interconnection of conductors.

In the "Dicing" step, the substrate is cut along pre-formed "dicing" lines (gaps between individual dies on the substrate) to form individual chips. The Dicing step normally is performed after all other layer-forming steps have been completed.

Finally, in the "Assembly" step, the individual chips are enveloped in packages.

In methods according to the invention, the parent mask and progeny mask can be inspected while performing the progeny-mask fabrication method. Hence, mask inspection and evaluation can be performed within a short time very accurately.

Methods according to the invention provide higher accuracy CPB microlithography masks than conventionally. As a result, microelectronic devices can be manufactured with improved yield without sacrificing accuracy.

Whereas the invention has been described in connection with representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A method for fabricating a charged-particle-beam (CPB) mask, comprising:
   (a) on a parent mask, defining all elements of a desired circuit pattern to be defined on the CPB mask;
   (b) using the parent mask as a lithography mask, transferring the pattern defined on the parent mask to a progeny mask by reduction lithography, so as to define on the progeny mask the elements of the desired circuit pattern, the elements on the progeny mask corresponding to but being smaller than respective elements on the parent mask, the progeny mask being destined for use as the CPB mask; and
   (c) comparing the pattern as formed on the progeny mask with the pattern formed in the parent mask to determine an accuracy with which the progeny mask defines the circuit pattern.

2. The method of claim 1, wherein step (a) comprises the steps of preparing circuit-design data for the desired circuit pattern, converting the data into corresponding circuit-pattern elements to be defined by the parent mask, and forming the circuit-pattern elements on the parent mask according to the converted data.

3. The method of claim 1, wherein, in step (b), the pattern defined on the parent mask is transferred to the progeny mask by optical lithography.

4. The method of claim 1, further comprising the step, between steps (a) and (b), of comparing and contrasting the parent mask with data concerning the desired circuit pattern.

5. The method of claim 4, wherein, if the parent mask corresponds with the data concerning the desired circuit pattern, then the method further comprises the steps of:

determining whether the parent mask has any defects;

if the parent mask has defects that are repairable, then repairing the defects; and the parent mask has defects that are not repairable, then discarding the parent mask.

6. The method of claim 1, further comprising the steps, after step (c), of:

determining whether the progeny mask has any defects;

if the progeny mask has defects that are repairable, then repairing the defects; and if the progeny mask has defects that are not repairable, then discarding the progeny mask.

7. A CPB mask, produced by a method as recited in claim 1.

8. A method for performing CPB microlithography, comprising:

(a) providing a CPB mask as recited in claim 7;

(b) directing a CPB illumination beam to a region on the CPB mask; and (c) directing a CPB patterned beam, formed by passage of charged particles of the illumination beam passing through the illuminated region on the CPB mask, to a sensitive substrate.

9. A method for manufacturing a microelectronic device, comprising:

(a) providing a sensitive substrate; and (b) performing CPB microlithography of the sensitive substrate, according to the method as recited in claim 8.

10. The method of claim 9, wherein step (b) is performed in a step-and-repeat manner.

11. The method of claim 9, wherein step (b) is performed in a scanning manner.

12. A microelectronic device, manufactured according to the method recited in claim 9.

13. A method for fabricating a charged-particle-beam (CPB) mask, comprising:

(a) on a parent mask, defining all elements of a desired circuit pattern to be defined on the CPB mask; and (b) using the parent mask as a lithography mask, transferring the pattern defined on the parent mask to a progeny mask by reduction lithography, so as to define on the progeny mask the elements of the desired circuit pattern, the elements on the progeny mask corresponding to but being smaller than respective elements on the parent mask, the progeny mask being destined for use as the CPB mask.

14. The method of claim 13, wherein step (a) comprises the steps of:

preparing circuit-design data for the desired circuit pattern, converting the data into corresponding circuit-pattern element to be defined by the parent mask, and forming the circuit-pattern elements on the parent mask according to the converted data.

15. The method of claim 13, further comprising the step, after step (a), of comparing and contrasting the pattern as defined on the parent mask with data concerning the desired circuit pattern.

16. The method of claim 15, further comprising the steps, if the pattern as defined on the parent mask corresponds with the data concerning the desired circuit pattern, of:

determining whether the parent mask has any defects; and if any determined defects are repairable, then repairing the defects.

17. The method of claim 13, further comprising the step of inspecting the progeny mask for any defects in the pattern.

18. The method of claim 17, further comprising the step, if the inspecting step revealed any defects in the progeny mask, of repairing the defects.

* * * * *